United States Patent [19]

Fujikawa et al.

[11] Patent Number: 5,698,373
[45] Date of Patent: Dec. 16, 1997

[54] PHOTOSENSITIVE RELIEF PRINTING PLATE AND PHOTOSENSITIVE INTAGLIO PRINTING PLATE

[75] Inventors: Junichi Fujikawa, Kyoto; Takao Kinashi, Ohtsu; Shigetora Kashio, Kohga-gun; Yasuko Yokoyama, Ohtsu, all of Japan

[73] Assignee: Toray Industries, Incorporated, Tokyo, Japan

[21] Appl. No.: 284,903

[22] Filed: Aug. 2, 1994

Related U.S. Application Data

[63] Continuation of Ser. No. 15,259, Feb. 8, 1993, abandoned, which is a continuation of Ser. No. 716,531, Jun. 17, 1991, abandoned, which is a continuation-in-part of Ser. No. 410,252, Sep. 21, 1989, abandoned.

[30] Foreign Application Priority Data

Sep. 22, 1988 [JP] Japan .................... 63-238151
Apr. 3, 1989 [JP] Japan .................... 1- 85182

[51] Int. Cl.⁶ .................... G03F 7/037; G03F 7/033
[52] U.S. Cl. .................... 430/288.1; 430/281.1; 430/917; 430/918; 430/307
[58] Field of Search .................... 430/281, 288, 430/292, 306, 307, 917, 916, 281.1, 288.1

[56] References Cited

U.S. PATENT DOCUMENTS

| | | |
|---|---|---|
| 3,042,515 | 7/1962 | Wainer . |
| 3,637,382 | 1/1972 | Krauch . |
| 3,661,575 | 5/1972 | Ketley et al. . |
| 3,827,887 | 8/1974 | Hazy et al. . |
| 4,065,315 | 12/1977 | Yamazaki et al. . |
| 4,247,618 | 1/1981 | Dessauer et al. . |
| 4,251,619 | 2/1981 | Kurita . |
| 4,271,251 | 6/1981 | Aotani et al. . |
| 4,297,435 | 10/1981 | Jolly et al. . |
| 4,757,098 | 7/1988 | Merrem et al. . |
| 4,874,685 | 10/1989 | Adair . |
| 4,904,803 | 2/1990 | Fujita et al. .................... 548/548 |
| 4,923,781 | 5/1990 | Fujikura et al. . |

FOREIGN PATENT DOCUMENTS 1177685  11/1984  Canada .

OTHER PUBLICATIONS

"8–Hydroxyquinolines", Aldrich Chemical Catalog, Milwaukee, WI, p. 716.
Derwent's English Excerpts J63010–150–A, "Photosensitive resin plate for letterpress printing, etc." Polymer Applications, p. 34.

Primary Examiner—Christopher D. Rodee
Attorney, Agent, or Firm—Scully, Scott, Murphy & Presser

[57] ABSTRACT

The present invention relates to a photosensitive relief or intaglio printing plate comprising a base and a photocurable photosensitive layer formed on the base, the photocurable photosensitive layer containing a dye precursor which forms a dye upon irradiation of actinic light. A relief (convex) pattern or a concave pattern can be recognized by coloring, thereby facilitating the printing plate inspecting work. The developing solution used is not colored or contaminated.

11 Claims, No Drawings

PHOTOSENSITIVE RELIEF PRINTING PLATE AND PHOTOSENSITIVE INTAGLIO PRINTING PLATE

This is a continuation of application Ser. No. 015,259 filed on Feb. 8, 1993, abandoned, which is a file-wrapper-continuation application of Ser. No. 716,531 filed on Jun. 17, 1991, abandoned, which is a continuation-in-part application of Ser. No. 410,252 filed Sep. 21, 1989, abandoned.

BACKGROUND OF THE INVENTION

1. Field of the invention

The present invention relates to a photosensitive relief printing plate and a photosensitive intaglio printing plate.

A photosensitive relief printing plate or intaglio printing plate comprising a base such as a metallic base or plastic film base and a photocurable, photosensitive layer formed on the base is in wide use.

In the former relief printing plate, an original film having a negative pattern is brought into close contact with the photosensitive layer directly or indirectly, followed by irradiation of actinic light to cure the photosensitive layer portion corresponding to a transparent portion of the original film. Then, the uncured photosensitive layer portion corresponding to an opaque portion of the original film is dissolved out using a suitable solvent such as alcohol, alcohol/water, or water, to thereby form on the base relief pattern which is faithful to the original pattern.

On the other hand, in the intaglio printing plate, an original film having a positive pattern is brought into close contact with the photosensitive layer directly or indirectly, followed by irradiation of actinic light to cure the photosensitive layer portion corresponding to a transparent portion of the original film, and then the uncured photosensitive layer is dissolved out using a suitable solvent to thereby form on the base a concave pattern which closely follows the original.

2. Description of the Prior Art

According to the prior art, even if image exposure is made for a photosensitive relief printing plate or intaglio printing plate through an original film, there will occur no visible change on the photosensitive layer. Therefore, it has been difficult to confirm to which printing plate an original film was exposed and also difficult to confirm whether a printing plate has already been subjected to exposure or not. Consequently, there occurs the trouble that another original film is brought into close contact with an already-exposed printing plate and then subjected to exposure.

Also in the plate inspecting work to check whether the resulting relief or concave pattern after the completion of exposure and development is as predetermined or not, it is difficult to Judge whether the relief or concave pattern, which is colorless and fine, is good or bad. According to the prior art, in order to remedy the difficulty of the plate inspecting work, that is, in order to facilitate the same work, a usual dye or pigment is incorporated in the photosensitive layer to color the relief pattern or concave pattern (to be exact, a pattern formed by the photocured photosensitive layer portion other than the concave portion). However, if the whole of the photosensitive layer is colored, the dye or pigment contained in the uncured portion will be dissolved out into a developing solution at the time of development, thus causing conspicuous coloration of the developing solution. Consequently, there arise problems such as pollution of the environment caused by used developing solutions as well as contamination of developing units or of the working evironment.

As a prior art literature wherein a photosensitive resin containing a photocolorable dye precursor is applied to a printing plate, there is mentioned U.S. Pat. No. 4,271,251 (the corresponding Japanese Pantent Laid-Open No. JP55055335A). This prior art literature is mainly for planographic printing plates each having a photosensitive layer 0.1–5 μm thick. Since the photosensitive layer is thus thin, a large amount of a dye precursor is contained therein, so for preventing the dye precursor from developing color during storage in a dark place, so-called dark coloration, it is proposed therein to use 2,4-dihydroxybenzaldoxime which is a powerful dark coloration preventing agent.

However, if such method is directly applied to relief or intaglio printing plates which are generally thick, a photocuring reaction is also inhibited in many cases. This bad influence is not so conspicuous in the case of a thin photosensitive layer such as that in a planographic printing plate. But in relief or intaglio printing plates having a thick photosensitive layer, there often arise problems, such as marked deterioration in photocurability of the bottom of the photosensitive layer, so it is impossible to attain satisfactory image reproducibility.

Japanese Patent Laid-Open No. 10150/1988 discloses that an anti-blocking layer is formed on the surface of a photosensitive resin layer and that a dye precursor which forms a dye upon irradiation of actinic light is incorporated in the said anti-blocking layer. However, since the anti-blocking layer does not possess photosensitivity, it is removed at the time of development, resulting in that the developing solution is colored. Moreover, since the anti-blocking layer which has been colored is removed, a concave or convex pattern formed by exposure of the printing plate after the development is not colored. Consequently, it becomes no longer possible to easily confirm the pattern visually.

In U.S. Pat. No. 4,247,618 (the corresponding Japanese Patent Laid-Open No. 151638/1980) it is disclosed that a desired pattern is colored using a leuco dye. But the application to such a photocurable photosensitive layer as is employable as a relief or intaglio printing plate after development is not disclosed therein.

SUMMARY OF THE INVENTION

The present invention has been accomplished in view of the above-mentioned drawbacks of the prior art, and it is an object thereof to provide a photosensitive relief or intaglio printing plate wherein at the time of image exposure through an original film and subsequent development, only the exposed portion, or photocured portion, is colored due to the formation of a dye a the resulting convex or concave pattern becomes visible, thus attaining an extremely high processing work efficiency.

It is another object of the present invention to provide a relief or intaglio printing plate wherein only exposed and cured portion is colored, so there is no coloration of developing solution even after development and removal of uncured portion, that is, there is no fear of environmental pollution caused by the developing solution.

More preferably, the present invention can provide a photosensitive relief or intaglio printing plate which is superior in dark coloration preventing property, does not inhibit a photocuring reaction, does not cause such a problem as marked deterioration in photocurability of the bottom of a photosensitive layer, and can afford a good image reproducibility.

More specifically, the present invention is concerned with a photosensitive relief or intaglio printing plate comprising a base and a photocurable photosensitive layer formed thereon, the photocurable photosensitive layer containing a dye precursor which forms a dye upon irradiation of actinic light.

As a preferred embodiment the present invention relates to a photosensitive relief or intaglio printing plate having a quinolinol and/or thiol compounds(s) as a dark coloration preventing agent incorporated in the aforementioned photocurable photosensitive layer.

DESCRIPTION OF THE PREFERRED EMBODIMENT

As the photocurable photosensitive layer used in the present invention there may be used any of various known ones which are commonly used as photocurable photosensitive layers in photocurable photosensitive relief or intaglio printing plates. More specifically, there usually is employed a photosensitive composition containing a compound having two or more ethylenically unsaturated bonds and also containing a photopolymerization initiator.

As examples of the compound having two or more ethylenically unsaturated bonds there are included all of known such compounds. The following are mentioned as concrete examples generally used in the photosensitive layer of a photosensitive relief printing plate or a photosensitive intaglio printing plate, which however are not intended to constitute any limitation: di(meth)acrylates of polyethylene glycol such as diethylene glycol diacrylate and diethylene glycol dimethacrylate [both will hereinafter be referred to as diethylene glycol di(meth)acrylate, and the description ΔΔΔ (meth) ∇∇∇ which will appear hereinunder means both ΔΔΔ∇∇∇ and ΔΔΔ meth ∇∇∇, wherein ΔΔΔ and ∇∇∇ mean generically some type of chemical name, polypropylene glycol di(meth)acrylates such as dipropylene glycol (meth)acrylate, trimethylolpropane tri(meth)acrylate, pentaerythritol tri(meth)acrylate, pentaerythritol tetra(meth) acrylate, glycerol di(meth)acrylate, glycerol tri(meth) acrylate, polyvalent(meth)acrylates obtained by addition of polyvalent glycidyl ethers such as ethylene glycol diglycidyl ether with compounds having ethylenically unsaturated bonds and active hydrogen such as unsaturated carboxylic acids or unsaturated alcohols, polyvalent(meth)acrylates obtained by addition reaction of unsaturated epoxy compounds such as glycidyl (meth)acrylate with compounds having active hydrogen such as carboxylic acids or amines, polyvalent(meth)acrylamides such as methylenebis (meth) acrylamide, polyvalent vinyl compounds such as divinylbenzene. Further, unsaturated polyesters, unsaturated polyurethanes and end-unsaturated synthetic rubbers are also included if only they each have two or more ethylenically unsaturated bonds in the same molecule. Two or more of these unsaturated compounds may be used in combination.

Also, a compound having only one ethylenically unsaturated bond such as 2-hydroxyethyl (meth)acrylate, 3-chloro-2-hydroxypropyl (meth)acrylate, β-hydroxyethyl-β'-(meth)acryloyloxy ethyl phthalate or diacetone acrylamide may be used together with the compound having two or more such unsaturated bonds.

Also employable are photosensitive compositions comprising, as base resins, partially saponified polyvinyl acetate, polyamides, saturated polyesters, polyurethanes, celluloses or synthetic rubbers, and ethylenically unsaturated compounds incorporated therein. Particularly, in the printing plate use, partially saponified polyvinyl acetate and polyamides are preferred as base resins. These base resins may be used in the range of 5 to 95 wt % relative to the whole of the photosensitive layer.

Also as the photopolymerization initiator there may be used any of known ones. As examples are mentioned anthraquinones such as anthraquinone, 2-methyl anthraquinone and 2-ethyl anthraquinone; benzoin and benzoin derivatives such as benzoin methyl ether and benzoin ethyl ether; thioxanthone derivatives such as chloro thioxanthone and diisopropyl thioxanthone; benzophenone and benzophenone derivatives such as 4,4-bis(dimethylamino) benzophenone; acetophenone and acetophenone derivatives such as dimethoxyphenyl acetophenone; and benzyl. But these constitute no limitation. Two or more compounds may be used in combination as the photopolymerization initiator. The photopolymerization initiator may be used in the range of 0.01 to 10 wt % relative to the whole of the photosensitive layer-forming composition.

As the dye precursor which forms a dye upon irradiation of actinic light in the present invention, there may be used any of known ones. Examples include spiropyrans, having various substituent groups such as spiro[2H-1-benzopyran-2,2'-indolines], spiroindolinonaphopyrans, spiro[2H-1-benzopyran-2,2'-benzothiazolines], spiro[2H-1-benzopyran-2,2'-benzoxazolines] and aza-spiroindolinopyrans; triarylmethane dye leuco derivatives such as Leuco Crystal Violet and Leuco Malachite Green; xanthene dye leuco derivatives such as 3,6-bis(dimethylamino)-9-(p-dimethylaminophenyl )xanthene; thioxanthene dye leuco derivatives such as 3,6-bis(dimethylamino)-9-(p-dimethylaminophenyl) thioxanthene; fluoran dye precursors such as 1,3-dimethyl-6-diethylarainofluoran and 3,6 -bis (diethylamino)fluoran-α-(4'-nitro)-anilino lactam; cationic polymethine dye such as α, β-bus(p-dimethylaminophenyl) polyene: bis-imidazoles such as bis-2,4,5-triarylimidazole: and thioindigo such as 6,6'-dichloro-4,4'-dimethylthioindigo. Particularly, triaylmethane dye leuco derivatives and fluoran dye precursors, which develop color more clearly, are preferred in the present invention.

It is preferable that the amount of the photocolorable dye precursor used be in the range of 0.001 to 5 relative to the whole of the photosensitive layer. If it is smaller than 0.001 wt %, there will not be attained a satisfactory effect because of slight coloration of an irradiated portion, while it it exceeds 5 wt %, the photocurability of the photosensitive layer is markedly deteriorated in many cases because a considerable portion of the radiated actinic light is consumed for the formation of a dye. A more preferred amount of the dye precursor used is in the range of 0.05 to 2 wt %. Two or more dye precursors may be used together.

If necessary, the photosensitive layer in the present invention may be formed on a metallic plate or cylinder roll base formed of steel, aluminum or copper or on a plastic film or sheet base formed of polyester, polyamide or polypropylene.

The thickness of the photosensitive layer is preferably not smaller than 100 μm, more preferably not smaller than 200 μm, in the case of a relief printing plate. Where the photosensitive layer is thinner, it is likely that the non-image area of a printed matter will be stained because ink is fed also to the other portion than relief. Although the upper limit of the thickness is not specially limited, it is usually 7 mm or so. In the case of an intaglio printing plate, it is preferable that the thickness of the photosensitive layer be not smaller than 6 μm, more preferably no smaller than 10 μm. if the photosensitive layer is thinner, there in many cases arises the problem that even the ink in the concave portion as an image area is scraped off at the time of scraping off the ink in the non-image area on the printing plate by means of a doctor blade. The upper thickness limit of the photosensitive layer is no specially limited, but usually it is 1 mm or so. In the case of a relief printing plate, exposure is made through a negative film and an image area is photocolored, while in an intaglio printing plate, exposure is made through a positive film, so there is formed a pattern in which a non-image area is colored while an image area not colored.

In applying the photosensitive layer containing the photocolorable precursor to a printing plate, it is desirable to use a so-called dark coloration preventing agent for preventing the dye precursor from developing color during storage in a dark place. In U.S. Pat. No. 4,271,251 (the corresponding Japanese Patent Laid-Open No. 55363/1980) it is proposed to use 2,4-dihydroxybenzaldoxime as such dark coloration preventing agent. This prior art is mainly for planographic printing plates having a photosensitive layer thickness of 0.1 to 5 μ. Because the photosensitive layer is thin, a large amount of a dye precursor is contained therein, and it is proposed in the said prior art to use 2,4-dihydroxybenzaldoxime which is a powerful dark coloration preventing agent. Further, Japanese Patent Laid-Open No. 10150/1988 discloses that such antioxidants as hydroquinone and p-aminophenol are effective in preventing the dark coloration. However, the addition of these stabilizers often ihibits even the photocuring reaction. This bad influence is not so conspicuous in the case of a thin photosensitive layer such as that in a planographic printing plate. However, in the case of a relief or intaglio printing plate having a thick photosensitive layer, there often arise problems such as, for example, marked deterioration in photocurability of the bottom of the photosensitive layer.

In the present invention, if quinolinol or a thiol compound as a dark coloration preventing agent is incorporated in the photosensitive layer, there can be obtained a more preferable relief or intaglio printing plate. Quinolinol is very effective in preventing the dark coloration. Besides, quinolinol possesses the feature that it scarcely deteriorates the photosensitive characteristic. Although it is not clear by what reaction mechanism quinolinol prevents the dark coloration, it is presumed that the quinoline structure will probably prevent the oxidation reaction of the dye precursor which takes place in the photosensitive layer. Further, since the hydroxyl group improves the compatibility with the photosensitive composition, it is also presumed that the resulting synergistic effect may lead to an outstanding effect.

The term "quinolinol" as used herein is a generic term for seven kinds of compounds each having one hydroxyl group in any of the positions 2–8 in the following guinoline structure:

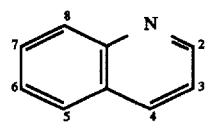

Among them, 8-quinolinol (alias oxine) with hydroxyl group in the 8-position and 4-quinolinol (alias kynurine) with hydroxyl group in the 4-position are particularly preferred in view of their dark coloration preventing effect. The amount of quinolinol to be used is preferably in the range of 0.005 to 1 wt % relative to the whole of the photosensitive layer. If it is less than 0.005 wt %, the dark coloration preventing effect is difficult to be fully exhibited, and if it exceeds 1 wt %, a bad influence on the photosensitive characteristic will become no longer ignorable. Particularly preferably, quinolinol is used in the range of 0.01 to 0.5 wt %. Two or more kinds of quinolinols may be used in combination.

Further, according to a study made by the present inventors it turned out that by the addition of a thiol compound such as n-octylthiol, n-nonylthiol, n-decylthiol, n-undecylthiol, n-dodecylthiol, thiophenol, benzylthiol, ethylene thioglycol or thioglycerin the dark coloration could be prevented with little deterioration of photosensitivity even in the case of a relief or intaglio printing plate having a thick photosensitive layer.

It is desirable that the amount of such thiol compound used be in the range of 0.05 to 5 wt % relative to the entire photosensitive resin. An amount thereof less than 0.05 wt % will be less effective in preventing the dark coloration, and if its amount exceeds 5 wt %, marked deterioration of photosensitivity often results. A more preferable amount of the thiol compound to be added is in the range of 0.2 to 2 wt %. Two or more thiol compounds may be used in combination.

Also, a combined use of a quinolinol and a thiol compound may be made in the range of 0.005 to 5 wt % relative to the entire photosensitive layer. The use of a phosphite compound such as tributyl trtthtophosphite, trioctyl trithiophosphite and dilauryl dithiobutyl phosphite in the range of 0.01 to 1 wt % also affords a synergistic effect.

As the dark coloration preventing agent, there may be used at least one compound selected from the group consisting of sulfur-based antioxidants, phosphorus-based antioxidants, phenol-based antioxidants, amine-based antioxidants, benzophenone-based antioxidants, benzotriazole-based antioxidants and citric acid.

Examples of the sulfur-based antioxidants include dilaurylthiodipropionate, distearylthiodipropionate, laurylstearylthiodipropionate, distearyl-β, β'-thiodibutylate, ditridodecanethiodipropionate, tetrahydroxymethylthiolauryl-propionatemethane, zinc-n-dithiocarbonate, zinc-diethyldithiocarbonate, thiodipropionic acid, 4,4'-thio-bis (3-methyl-6-t-butylphenol), 4-(4'-di (3-alkylmercapto-propionyloxy)-2,2'-dimethyl-5,5-di-t-butyl diphenyl sulfide, dibutylthiourea 2-mercaptobenzimidazole and the like.

Examples of the phosphorus-based antioxidants include triphenyl phosphite, tri(nonyl-phenyl) phosphite, tridecyl phosphite, trioctadecyl phosphite, trilauryl trithio phosphite, diphenylindecyl phosphite, cyclic neopentanetatrabis (distearylpentaerythritol diphosphite, 4,4'-isopropilidenediphenylalkyl phosphite, 2-t-butyl-α-(3-t-butyl-4-hydroxyphenyl)-p-cumenyl bis(p-nonylphenyl) phosphite and the like.

Examples of the phenol-based antioxidants include butylated hydroxy anisol, 2-2'-methylene bis-(4-methyl-6-t-butylphenol), 1,1,3-tris-(2-methyl-4-hydroxy-5-t-butylphenyl) butane and the like.

Examples of the amine-based antioxidants include phenyl-α-naphthyl amine, N, N'-di-sec-butyl-p-phenylene diamine and the like.

Examples of the benzophenone-based antioxidants include 2-hydroxy-4-octoxybenzophenone, 2-hydroxy-4-methylbenzophenone and the like.

Examples of the benzotriazole-based antioxidants include 2(2'-hydroxy-5'-methylphenyl) benzotriazole, 2(2'-hydrox-3'-t'butylphenyl) benzotriazole and the like.

Among them, the phosphorus- and sulfur-based antioxidants are preferable. Ether type sulfur-based antioxidants are more preferable. Moreover, the use of such phosphorus- or sulfur-based antioxidant together with a quinoline compound will prevent effectively the dye precursor contained in the photosensitive resin composition from developing color at hearing or during storage at a high temperature or during storage for a long period of time in a dark place.

The amount of the antioxidant may be decided in accordance with the kind and amount of the dye precursor and the relation with the photosensitive resin to be used. Preferably, the amount is in the range of 1.0 to 20.0 parts by weight, more preferably 2.0 to 10.0 parts by weight per 1.0 part by weight of the dye precursor. Two or more antioxidants may be used in combination.

Another type of the dark coloration preventing agent is a five membered furan-type heterocyclic compound having at least one selected from the group consisting of hydroxy group, aldehyde or hetero atom constituting the heterocyclic compound is one oxygen atom and the ring may be saturated or unsaturated.

Examples of the furan-type heterocyclic compound having hydroxy group include furfuryl alcohol, sorbitol, tetrahydrofurfuryl alcohol, 5-methylfurfuryl alcohol, 5-propargylfurfuryl alcohol, 2-methyl-5-(2'-propinyl)-3-hydroxymethyl furan, 2-methyl-2-vinyl-5-(1'-hydroxy-1'-methylethyl) tetrahydrofuran, 2-furfuryl glycidyl ether, furfuryl acetate, furfuryl alkyl (C2,3) carboxylate, tetrahydroxyfurfuryl oleate, furfuryl p-hydroxybenzoate, sorbitol cyclic carboxylate ester, sorbitol dimer acids ester and the like.

Examples of the furan-type heterocyclic compound having aldehyde and/or ketone include 2-methyl-5(β-formyl-ethyl) furan, 3-(2'-amylfuran-3'-yl) propanal tetrahydrofuranone-2, α-butylolactone, α-alkyl (C10-14) lactone, 5-keptyl-tetrahydro-2-furanone, 5-hexyl-4,5-dehydro-2(3H) furanone, 2-furyl methyl ketone, 2-acetyl-5-methyl furan, 3-acetotetrahydrofuranone-2, 3-chloro-3-aceto-tetrahydrofuranone-2, 1,5-bis(5'-nitro-2'-furyl)-1,4 pentadiene-3-one, S-bis-5-nitro-2-furfurylidene-acetoneguanidylhydrazone hydrochloride, 1,5-bis(5'nitro-2'-furyl)-1,4-pentadiene-)-one-amizihydrazone, β-methyl-α-alkyl (C1-2)-α-hydroxy-, β-dehydro-α-butylolactone, dl-pantolactone, D-acetyl-pantolactone, D-benzoin pantolactone, L-ascorbic acid, D-arabo-ascorbic acid, sodium D-aroboascorbate, ascorbyl alkyl (C16-18) carboxylate, ascorbyl 2,6-dialkyl (C16-18) carboxylate, (2-furyl)-hydroxymethyl ketone, lanaloside C, deslanoside, digitoxin, strophanthin and the like. Among them, aldehyde and/or ketone-containing compounds are preferable. The amount is preferably in the range of 0.01 to 100 parts by weight, more preferably 0.01 to 20 parts by weight per 1.0 part by weight of the dye precursor. Two or more may also be used in combination.

Further type of the dark coloration preventing agent is an aromatic carboxylate ester derivative having at least one hydroxy group adjacent to the aromatic group. Examples include alkyl (C1-22) hydroxybenzoate, alkyl (C1-4) sodiumoxy-benzoate, alkyl (C9-18) p-hydroxybenzoate, alkenyl (C3-18) p-hydroxybenzoate, phenyl hydroxybenzoate, phenyl p-hydroxybenzoate, phenylalkyl (C1-3) salicylate, benzyl salicylate, t-butylphenyl salicylate, alkyl (C1-18) gallate and the like. The amount is preferably in the range of 0.01 to 100 parts by weight, more preferably 0.01 to 20 parts by weight per 1.0 part by weight of the dye precursor. Two or more may also be used in combination.

EXAMPLE 1

100 parts by weight of partially saponified polyvinyl acetate having a saponification degree of 75 mole % was dissolved 150 parts by weight of a mixed ethanol/water= 50/50 (weight ratio) solvent under heating at 60° C. Then, 70 parts by weight of an addition reaction product of 1 mole propylene glycol diglycidyl ether with 2 moles acrylic acid and 30 parts by weight of diethylene glycol were added as a photopolymerizable compound and a compatibilizing agent, respectively. Further added were 2 parts by weight of dimethylbenzyl ketal and 0.2 part by weight of Leuco Crystal Violet as a photosensitizer and a dye precursor, respectively, followed by thorough agitation and mixing.

The resulting photosensitive resin solution was cast over an epoxy adhesive pre-applied steel base 250 μm thick so that the thickness of a photosensitive layer after drying was 700 μm. The base was then placed in a hot-air oven held at 60° C. for 5 hours to remove the solvent, whereby a relief printing plate was prepared.

Then, a negative film for test was brought into close contact in vacuo with the upper surface of the photosensitive layer of the relief printing plate, and exposure was made for 2 minutes using an ultra-high pressure mercury vapor lamp. As a result, only the exposed portion was colored in bright bluish purple in the form of the original pattern. Thereafter, development was performed in a spray type developing unit (water temperature: 30° C., spray pressure: 5 kg/cm$^2$) containing tap water for 5 minutes. As a result, uncured portion, not colored, was removed completely. In this way there was obtained a relief pattern of bluish purple having even a fine portion of the original pattern reproduced on the steel base. The relief pattern was measure for color tone using a Macbeth densitometer, which was found to be 0.80. The developing solution was little colored.

EXAMPLE 2

100 parts by weight of "Amilan" CM-9000, an alcohol-soluble polyamide manufactured by Toray Industries Inc., was dissolved in 180 parts by weight of a mixed ethanol/water=80/20 (weight ratio) solvent under heating at 80° C. Then, as photopolymerizable compounds there were added 50 parts by weight of an addition reaction product of 1 mole ethylene glycol diglycidyl ether with 2 moles methacrylic acid and 10 parts by weight of pentaerythrltol triacrylate. Further added were 5 parts by weight dimethylbenzyl ketal and 1 part by weight of Leuco Crystal Violet as a photosensitizer and dye precursor, respectively, followed by thorough agitation and mixing.

The resulting photosensitive resin solution was cast over a polyester adhesive pre-applied polyester film 350 μm thick so that the thickness of the photosensitive layer after drying was 25 μm. The base was then placed for drying in a hot-air oven held at 100° C. for 5 minutes.

A positive film for test was brought into close contact in vacuo with the upper surface of the photosensitive layer of the intaglio printing plate thus obtained, and exposure was made for 90 seconds using a chemical lamp. As a result, only the exposed portion was colored in bluish purple. Then, development was performed for 15 seconds in a brush type developing unit (liquid temperature: 30° C.) containing a developer of ethanol/water=70/30 (weight ratio) to obtain a concave pattern with the other portion than the concave portion being colored in bluish purple. The color tone of the concave pattern was 0.45 as measured using a Macbeth densitometer. The developer was little colored.

EXAMPLE 3

55 parts by weight of an equimolar salt of α,ω-diamino polyoxyethylene obtained by adding acrylonitrile to both ends of polyoxyethylene having a number average molecular weight of 600 followed by reduction with hydrogen and adipic acid, 25 parts by weight of ε-caprolactam and 20 parts by weight of a salt of hexamethylenediamine and adipic acid were polymerized under ordinary conditions to prepare a polyamide.

100 parts by weight of the polyamide was dissolved in 150 parts by weight of a mixed ethanol/water=60/40 (weight ratio) solvent under heating at 80° C. Then, 2 parts by weight of glycidyl methacrylate was added and reaction was allowed to take place at 80° C. for 1 hour to introduce methacryloyl group into the ends of the polyamide. Further, 50 parts by weight of an addition reaction product of 1 mole ethylene glycol diglycidyl ether with 2 moles methacrylic acid, as a compound having two ethylenically unsaturated groups, and 5 parts by weight of an addition reaction product of 1 mole xylyl-enediamine with 4 moles glycidyl methacrylate, as a compound having four ethylenically unsaturated bonds, were added. Further added were 20 parts by weight of N-butyl benzenesulfonamide as a plasticizer, 5 parts by weight of benzophenone as a photopolymerization initiator, 0.4 part by weight of Leuco Crystal Violet as a dye precursor and 0.05 part by weight of 8-quinolinol (oxine), followed by thorough agitation and mixing.

The resulting photosensitive resin solution thus prepared was cast over a urethane adhesive pre-applied polyester film base 125 μm thick so that the thickness of the photosensitive layer after drying was 400 μm. The base was then placed in a hot-air oven held at 60° C. for 3 hours to remove the solvent. In this way there was obtained a relief printing plate lined with the polyester film base.

The photosensitive layer of the relief printing plate was measured for color tone using a Macbeth densitometer, which was found to be 0.27. Further, after storage in a dark place for five months, the color tone of the photosensitive layer was measured by the Macbeth densitometer and was found to be 0.29. From this fact it was confirmed that there was little development of color.

Next, the same negative film for test as that used in Example 1 was brought into close contact in vacuo with the photosensitive layer and exposure was made for 5 minutes using a chemical lamp. As a result, the exposed portion was colored in bright bluish purple. Then, development was performed for 1 minute in a brush type developing unit (water temperature: 25° C.) filled with tape water. In this way there was obtained a relief pattern colored in bluish purple on the film base. The color tone of the relief pattern was measured by the Macbeth densitometer and was found to be 0.75. An increase in color density of 0.44 induced by the exposure was confirmed. The developing solution was little colored.

EXAMPLE 4

100 parts by weight of "Amilan" CM-9000, an alcohol-soluble polyamide manufactured by Toray Industries Inc., was dissolved in 180 parts by weight of a mixed ethanol/water=80/20 (weight ratio) solvent under heating at 80° C. Then, 40 parts by weight of glycerol dimethacrylate as a compound having two ethylenically unsaturated bonds and 40 parts by weight of 3-chloro-2-hydroxypropyl methacrylate as a compound having one ethylenically unsaturated bond were added. Further added were 4 parts by weight of benzoin methyl ether and 0.1 part by weight of hydroquinone monomethyl eher as a photopolymerization initiator and a thermopolymerization inhibitor, respectively. Then, 1.5 parts by weight of Leuco Cyrstal Violet and 0.2 part by weight of 4-quinolinol (kynurine) were added as a dye precursor and a dark coloration preventing agent, respectively, followed by thorough agitation and mixing.

The resulting photosensitive resin solution was cast over a polyester adhesive pre-applied polyester film base 350 μm thick so that the thickness of the photosensitive layer after drying was 40 μm. The base was then placed for drying in a hot-air 100° C. oven for 6 minutes to obtain a photosensitive resin printing plate for intaglio printing.

The photosensitive layer of the intaglio printing plate was measured for color tone using a Macbeth densitometer, which was found to be 0.22. After storage in a dark place for six months, the printing plate was again measured for color tone of the photosensitive layer by Macbeth densitometer, which was 0.24. Thus, it was confirmed that there was little development of color.

A positive film for test was brought into close contact in vacuo with the upper surface of the photosensitive layer and exposure was made for 90 seconds using a chemical lamp. As result, only the exposed portion was colored in bright bluish purple. Then, development was performed for 25 seconds in a brush type developing unit (liquid temperature: 30° C.) containing a developing solution of ethanol/water=70/30 (weight ratio) to obtain a concave pattern wherein the other portion than the concave portion was colored in bluish purple. The color tone of the photosensitive layer was 0.51 as measured by the Macbeth densitometer. The developing solution was little colored.

EXAMPLE 5

55 parts by weight of an equimolar salt of α, ω-diamino polyoxyethylene obtained by adding acrylonitrile to both ends of polyoxyethylene having a number average molecular weight of 600 followed by reduction with hydrogen and adipic acid, 25 parts by weight of ε-caprolactam and 20 parts by weight of a salt of hexamethylenediamine and adipic acid were polymerized under ordinary conditions to prepare a polyamide.

100 parts by weight of the polyamide was dissolved in 150 parts by weight of a mixed ethanol/water=60/40 (weight ratio) solvent under heating at 80° C. Then, 2 parts by weight of glycidyl methacrylate was added and reaction was allowed to take place at 80° C. for 1 hour to introduce methacryloyl group into the ends of the polyamide. Thereafter, 40 parts by weight of an addition reaction product of propylene glycol diglycidyl ether with acrylic acid and 20 parts by weight of glycerol methacrylate were added as photopolymerizable compounds. Further added were 20 parts by weight of N-butyl benzenesulfonamide as a plasticizer, 3 parts by weight of dimethyl benzyl ketal as a photopolymerization initiator, 0.2 part by weight of Leuco Crystal Violet and 0.1 part by weight of 1,3-dimethyl-6-diethyl-aminofluoran as dye precursors, and 0.1 part by weight of 8-quinolinol and 1 part by weight of thioglycerin as dark coloration preventing agents, followed by thorough agitation and mixing.

The resulting photosensitive resin solution was cast over an epoxy adhesive pre-applied steel base 200 μm thick so that the thickness of the photosensitive layer after drying was 400 μm. The base was then placed in a hot-air 60° C. oven for 3 hours to remove the solvent. In this was there was obtained a relief printing plate lined with the steel base.

The relief printing plate was stored for two weeks under the conditions of 40° C. and a relative humidity of 80° C. But there was recognized no development of color induced by dark reaction. Then, the same negative film as that used in Example 1 was brought into close contact in vacuo with the photosensitive layer and exposure was made for 5 minutes using a chemical lamp. As a result, the exposed portion was colored in bright bluish purple. Thereafter, development was performed for 1 minute in a brush type developing unit (water temperature: 25° C.) filled with tap water. In this way there was obtained a relief pattern colored in bluish purple on the steel base. The color tone of the photosensitive layer was 0.60 as measured by a Macbeth densitometer. When this relief pattern was observed, it could be confirmed easily that even a fine portion was reproduced to a satisfactory extent. The developing solution was little colored.

According to the present invention, as set forth hereinabove, in a relief or intaglio printing plate it is possible to color a relief (convex) or concave pattern (to be exact, a pattern formed by the photocured photosensitive layer portion other than the concave portion), thereby facilitating the printing plate inspecting work, while maintaining good image reproducibility, without causing the problem of inhibition of a photocuring reactions such as marked deterioration in photocurability of the bottom of the photosensitive layer. Besides, there is little coloration of a developing solution, so it is possible to provide a photosensitive relief or intaglio printing plate which scarcely causes any such problem as environmental pollution by the used developer of contamination of the developing unit or of the working atmosphere.

What is claimed is:

1. An unexposed photosensitive relief printing plate or intaglio printing plate comprising a base and a photocurable photosensitive layer formed on the base, said photocurable photosensitive layer containing:

a. a partially saponified polyvinyl acetate or polyamide;
   b. a compound having two or more ethylenically unsaturated bonds;
   c. a photopolymerization initiator;
   d. a dye precursor which forms a dye with actinic light; and
   e. a dark coloration preventing agent comprising quinolinol present in a concentration of 0.005 to 0.1% by weight relative to the total weight of the photosensitive layer.

2. An unexposed photosensitive relief printing plate or intaglio printing plate as set forth in claim 1, wherein the content of said dye precursor is in the range of 0.001 to 5% by weight relative to the whole of the photosensitive layer.

3. An unexposed photosensitive relief printing plate or intaglio printing plate as set forth in claim 1, wherein the content of said dye precursor is in the range of 0.05 to 2% by weight relative to the whole of the photosensitive layer.

4. An unexposed photosensitive relief printing plate or intaglio printing plate as set forth in claim 1, wherein said dye precursor is the leuco form of a triarylmethane dye.

5. An unexposed photosensitive relief printing plate or intaglio printing plate as set forth in claim 1, wherein said dye precursor is a fluoran dye precursor.

6. An unexposed photosensitive relief printing plate as set forth in claim 1, wherein the thickness of the photosensitive layer is not smaller than 100 µm.

7. An unexposed photosensitive relief printing plate as set forth in claim 1, wherein the thickness of the photosensitive layer is not smaller than 200 µm.

8. An unexposed photosensitive intaglio printing plate as set forth in claim 1, wherein the thickness of the photosensitive layer is not smaller than 6 µm.

9. An unexposed photosensitive intaglio printing plate as set forth in claim 1, wherein the thickness of the photosensitive layer is not smaller than 10 µm.

10. An unexposed photosensitive relief printing plate or intaglio printing plate as set forth in claim 1, wherein the concentration of said quinolinol is in the range of 0.01 to 0.1% by weight relative to the total weight of the photosensitive layer.

11. An unexposed photosensitive relief printing plate or intaglio printing plate as set forth in claim 1, wherein said quinolinol is at least one member selected from the group consisting of 8-quinolinol and 4-quinolinol.

* * * * *

UNITED STATES PATENT AND TRADEMARK OFFICE
CERTIFICATE OF CORRECTION

PATENT NO. : 5,698,373
DATED : December 16, 1997
INVENTOR(S) : Junichi Fujikawa, et al.

It is certified that error appears in the above-identified patent and that said Letters Patent is hereby corrected as shown below:

Column 1, line 52: "Judge" should read --judge--

Column 4, line 8: "dimethylamlno" should read --dimethylamino--

Column 6, line 20: "trtthtophosphite" should read --trithiophosphite--

Column 8, line 36: "pentaerythrltol" should read --pentaerythritol--

Column 9, line 20: "polyesler" should read --polyester--

Signed and Sealed this

Ninth Day of November, 1999

Attest:

Q. TODD DICKINSON

*Attesting Officer*  *Acting Commissioner of Patents and Trademarks*